United States Patent [19]
Boyle

[11] Patent Number: 6,053,777
[45] Date of Patent: Apr. 25, 2000

[54] COAXIAL CONTACT ASSEMBLY APPARATUS

[75] Inventor: Stephen A. Boyle, Attleboro, Mass.

[73] Assignee: Rika Electronics International, Inc., Attleboro, Mass.

[21] Appl. No.: 09/145,914

[22] Filed: Sep. 2, 1998

Related U.S. Application Data

[60] Provisional application No. 60/070,475, Jan. 5, 1998.

[51] Int. Cl.$^7$ .................................................. H01R 13/24
[52] U.S. Cl. .......................................... 439/700; 439/482
[58] Field of Search .................................... 439/700, 824, 439/482; 324/761, 757, 754

[56] References Cited

U.S. PATENT DOCUMENTS

| | | | |
|---|---|---|---|
| 2,480,963 | 9/1949 | Quinn | 439/700 |
| 3,416,125 | 12/1968 | Theve | 439/700 |
| 3,976,352 | 8/1976 | Spinner | 439/700 |
| 4,012,105 | 3/1977 | Biddle | 439/700 |
| 4,138,643 | 2/1979 | Beck et al. | 324/158 |
| 4,245,189 | 1/1981 | Wahl et al. | 324/65 P |
| 4,397,519 | 8/1983 | Cooney | 439/824 |
| 4,740,740 | 4/1988 | Pollock et al. | 324/158 |
| 5,175,493 | 12/1992 | Langgard | 324/158 P |
| 5,291,129 | 3/1994 | Kazama | 324/158 P |
| 5,576,631 | 11/1996 | Stowers et al. | 324/761 |

*Primary Examiner*—Lincoln Donovan
*Assistant Examiner*—Hae Moon Hyeon
*Attorney, Agent, or Firm*—John A. Haug

[57] ABSTRACT

A coaxial contact assembly (10,10', 10") has a cylindrical ground plunger (30) which is fixedly attached to the ground conductor (1b) of a coaxial cable (1,1') through a ground sleeve (28) and mounted in a test head support (4) for sliding movement therein. An inner contact plunger barrel (18) is fixedly attached to the signal conductor (1a) of the coaxial cable either through a signal sleeve (16) for a replaceable inner contact assembly, or directly for a dedicated unit. An inner contact plunger (20) received in the plunger barrel has a contact portion (20c) biased outwardly to extend a selected amount beyond the ground plunger (30) in a given direction by a first spring member (24) while a second spring (36) biases the ground plunger outwardly in the given direction to a preset location. The spring force of the second spring is greater than that of the first spring so that initially plunger (20) will move inwardly independently of the ground plunger upon engagement with a test site until coplanarity occurs after which both the inner and outer contact portions will move together. Contact assemblies may be joined together through a flexible cable to form a double-ended configuration which can accommodate offset as well as in-line mounting. The ground plunger (30) and inner contact plunger barrel (18) are maintained in spaced coaxial relation by use of spaced members (32,34) in one embodiment and a single member having spaced apart portions (32',34') joined by a reduced diameter web (33) in a modified embodiment.

11 Claims, 4 Drawing Sheets

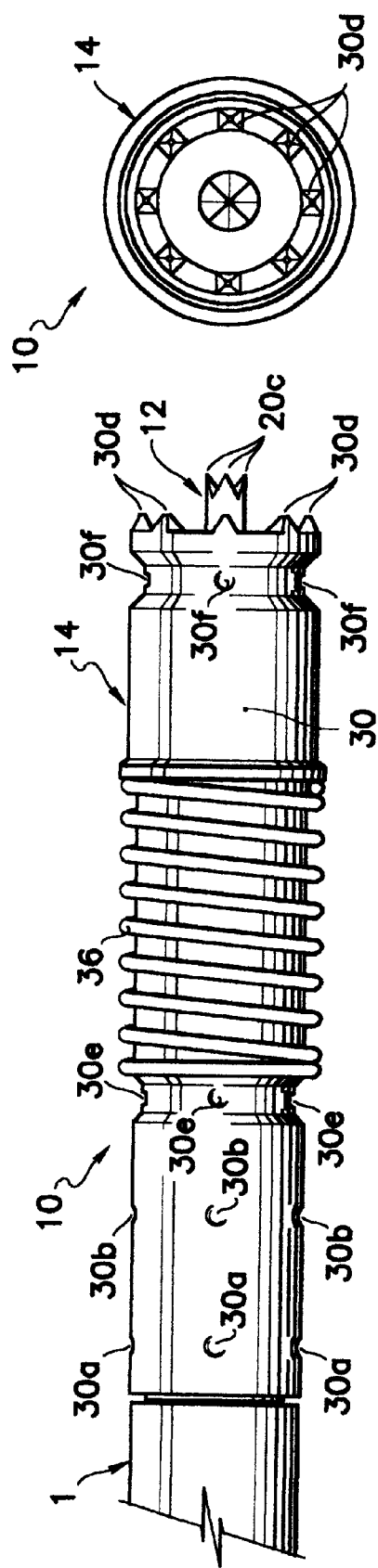
FIGURE 1
FIGURE 2
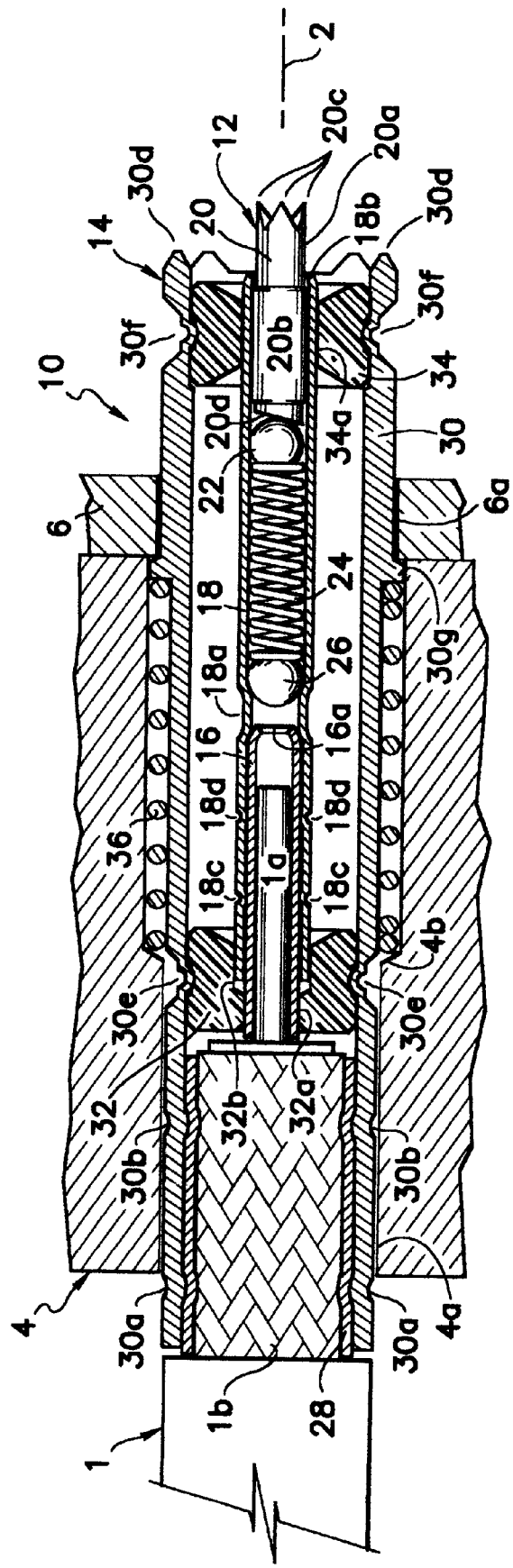
FIGURE 3

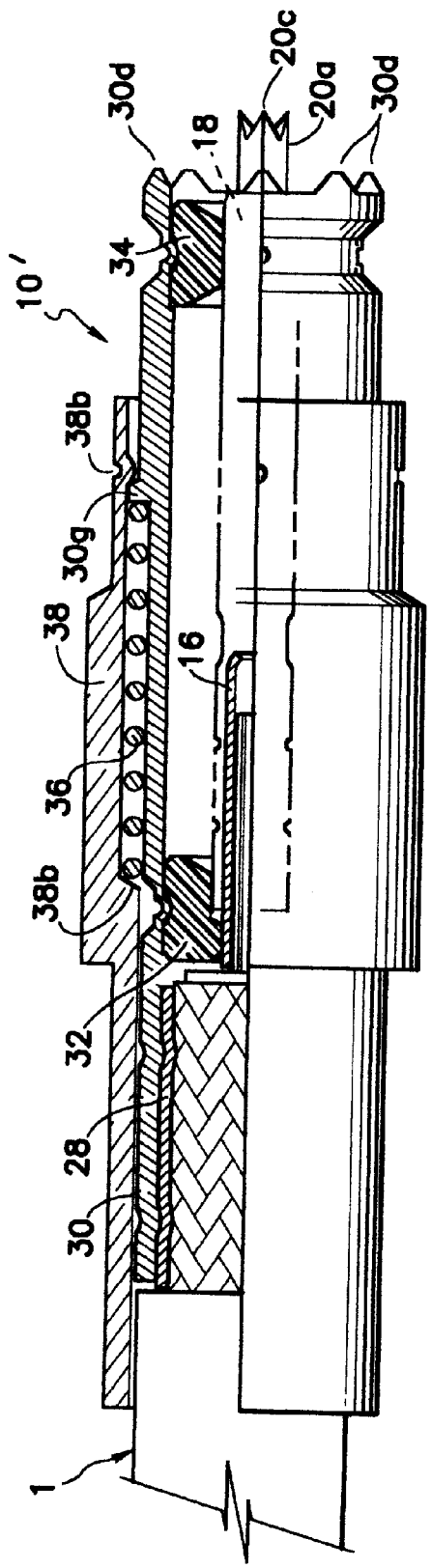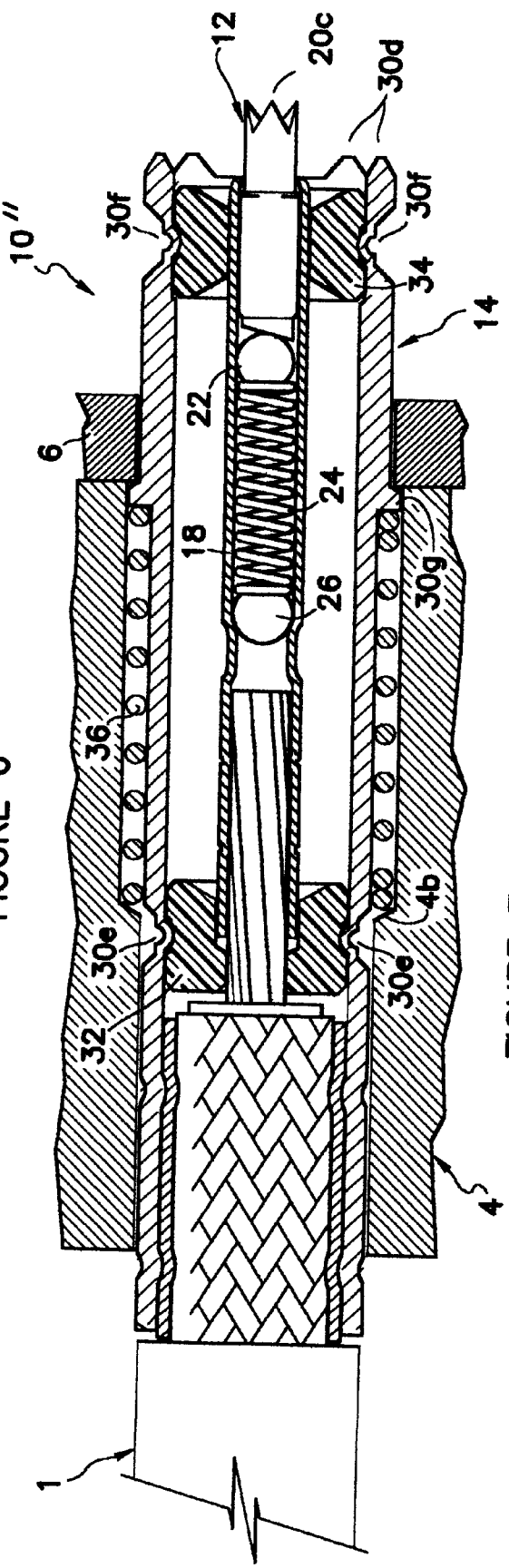

COAXIAL CONTACT ASSEMBLY APPARATUS

RELATED APPLICATIONS

Priority is claimed based on Provisional Application No. 60/070,475 filed Jan. 5, 1998.

FIELD OF THE INVENTION

This invention relates generally to electrical contact systems and more particularly to spring biased coaxial contacts used to interconnect test apparatus, analyzers and the like to circuit boards and the like to be tested.

BACKGROUND OF THE INVENTION

It is conventional to use spring biased contact assemblies, or probes, in testing printed circuit boards and other electrical apparatus for electrical continuity and the like. Typically, contact probes, generally comprising a center signal contact and an outer shield or ground contact, are mounted in a support and brought into relative movement with a device to be tested, such as a circuit board. Upon engagement with the test sites relative movement is continued for a selected distance, e.g., 0.090 inch is conventionally used in the industry, to ensure optimum contact engagement. Tests are performed by sending electrical signals through the test sites to check for electrical continuity and the like.

In carrying out such testing it is important that the contact assemblies have electrical characteristics closely matching the electrical characteristics of the electrical cable with which the contact assemblies are used. Further, signal mistiming, delay and degradation need to be minimized in using such contact assemblies. This is especially true when the contact assemblies are used with high speed apparatus where a delay in digital signal propagation can result in false readings.

Contact assemblies have moving parts and inherently have a degree of mismatch within the manufacturing tolerances and materials employed. Any mismatches which do occur are directly related to the length of the contact assemblies so that the longer the assembly, the greater the mismatch.

SUMMARY OF THE INVENTION

It is an object of the present invention to provide electrical contact apparatus for interconnecting test apparatus and the like with contact pads of a circuit board or other electrical device to be tested which minimizes signal mistiming, delay and degradation. Another object of the invention is the provision of such apparatus which is reliable, low cost and particularly effective for use with high speed cable. Another object is the provision of a coaxial contact assembly which has minimal moving parts and interconnection points and has a shorter overall length than conventional assemblies. Yet another object is the provision of a coaxial contact probe having electrical characteristics closely matching the electrical characteristics of high speed cable which is repeatable from one probe to another within a small tolerance band.

Briefly stated, an electrical contact assembly made in accordance with the invention comprises an outer ground contact assembly having an electrically conductive, tubular ground plunger with an outer contact portion at one end fixedly attached to the outer ground sleeve of a coaxial cable, an inner contact assembly having an electrically conductive inner plunger barrel received on the signal conductor of the coaxial cable and spaced from the ground plunger in coaxial relationship therewith. An inner contact portion of an inner plunger of the inner contact assembly is received in the plunger barrel and biased by a first spring to extend a selected amount in a given direction beyond the ground plunger when in an at rest position and a second spring biasing the ground plunger and coaxial cable in the given direction with the second spring having a spring force greater than the first spring. In operation, the inner contact portion which extends outwardly beyond the ground plunger and outer contact portion will engage the test site and be forced inwardly until it is coplanar with the outer contact portion of the ground plunger. Both contact portions will then move inwardly together, along with the cable, for another selected distance to ensure that predictable contact pressure is obtained for both the inner and outer contact portions. By combining the motion of the inner and the outer contact portions the overall length of the assembly is shortened thereby minimizing any impedance mismatch.

According to a feature of one embodiment of the invention, the inner contact assembly can be formed as a replaceable unit with compliant retention means formed on the inner plunger barrel which is receivable on a signal sleeve received on an exposed portion of the signal conductor of the coaxial cable to provide a reference location for positioning of the contact assembly. According to a feature of another embodiment, the inner plunger barrel is permanently attached directly to the signal conductor of the coaxial cable to provide a dedicated assembly and avoid high heat attachment with concomitant dielectric material limitations.

According to another feature of one embodiment of the invention the ground plunger is received in a mounting bore of an appropriate test head support along with the second spring and retained therein by a retainer plate. In a modified embodiment, the ground plunger and second spring are received in a separate mounting sleeve which in turn is mounted in a test head support.

According to another embodiment, a double ended probe is provided by placing a contact assembly made in accordance with the invention at each end of a flexible cable to allow either offset or in-line mounting.

According to another feature of the invention, the ground plunger and the inner contact assembly are maintained in coaxial relation with one another using first and second spaced apart annular spacer members of dielectric material so that the effective dielectric therebetween approximates that of air. In a modified embodiment, the spacer members are formed into an integral structure with a reduced diameter intermediate web joining two spacer portions, the reduced diameter web providing an open annular space with a resulting near air dielectric.

BRIEF DESCRIPTION OF THE DRAWINGS

Other objects, advantages and details of the novel and improved coaxial contact assembly of the invention appear in the following detailed description of preferred embodiments of the invention, the detailed description referring to the drawings in which:

FIG. 1 is a front elevational view of a coaxial contact assembly made in accordance with the invention;

FIG. 2 is a right side elevational view of the FIG. 1 assembly with the inner contact not shown for purposes of illustration;

FIGS. 3–5 are cross sectional views of the FIG. 1 assembly, in a slightly larger scale, mounted in a suitable test head support (broken away), the views showing different stages of operation;

FIG. 6 is a front elevational view, partly in cross section, of a modified embodiment of the invention;

FIG. 7 is a cross sectional view similar to FIG. 3 showing a modified embodiment;

DESCRIPTION OF PREFERRED EMBODIMENTS

Figure 4:
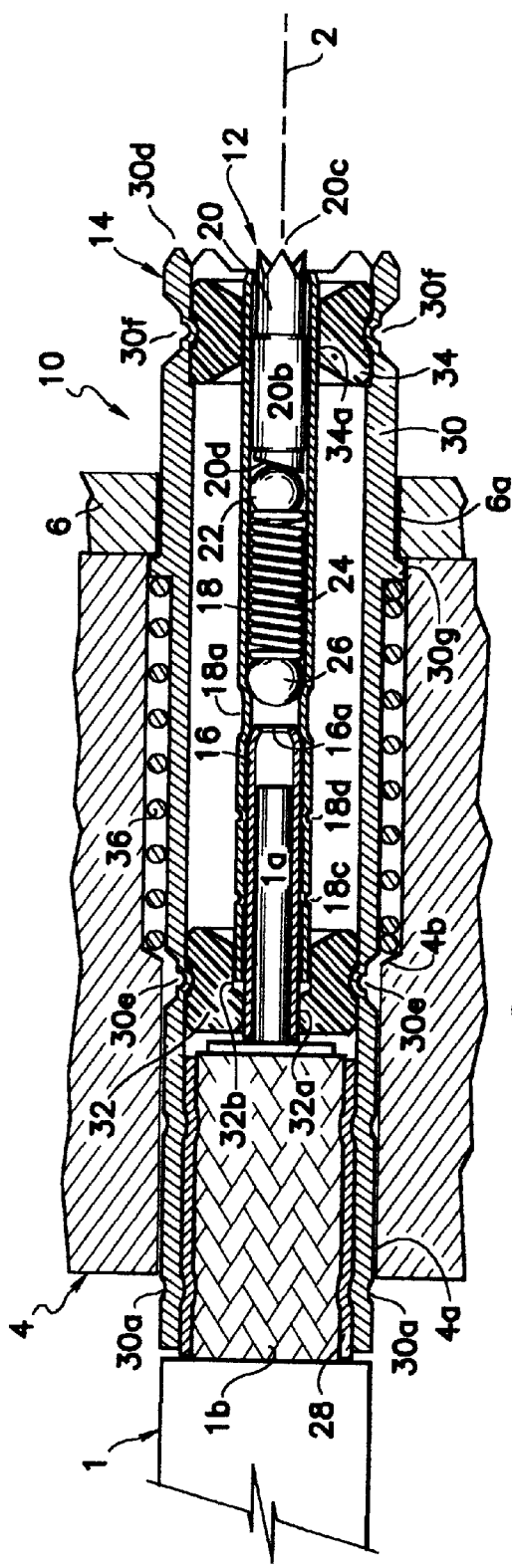

Referring to FIGS. 1–5, coaxial contact assembly 10, made in accordance with the invention, used to interconnect a coaxial cable 1, for example a 50 ohm flexible cable, with inner and outer contact pads of a unit to be tested comprises an inner probe or contact assembly 12 and an outer probe or ground assembly 14. Inner contact assembly 12 includes a cylindrical signal sleeve 16 formed of suitable electrically conductive material such as gold plated brass or other copper alloy which is received on signal conductor 1a of coaxial cable 1 and soldered, crimped or otherwise connected thereto providing optimum electrical and mechanical interconnection. Signal sleeve 16 has an open end 16a and a length chosen to be longer than the longest stripped portion of a group of signal conductors to which assemblies 10 are to be used to provide a reference location for the positioning of the remainder of the inner contact assembly which will be consistent from one contact assembly to another, as will be discussed below. An inner plunger barrel 18, formed of suitable electrically conductive material, such as a gold plated copper alloy, has opposed open ends with a suitable constriction 18a in its diameter at a selected location along its length closely fits over the signal sleeve 16 and is pushed onto the sleeve until distal end 16a engages the constriction to provide a known length extending from the constriction to open end 18b of inner plunger barrel 18. Inner plunger barrel 18 is retained on signal sleeve 16 by suitable retention means such as slightly compliant detents formed in the wall of inner plunger barrel 18. Although the specific number of detents is a matter of choice, two axially spaced sets 18c,18d of four detents each (only two are shown in each set in the drawings) spaced ninety degrees apart provides suitable electrical and mechanical connection. A generally cylindrical inner plunger 20, formed of suitable electrically conductive material having good mechanical properties such as gold plated beryllium copper, is received in inner plunger barrel 18 with a reduced diameter portion 20a extending out end 18b and cylindrical bearing surface 20b slidingly received in barrel 18. A suitable contact configuration 20c, such as a plurality of pointed projections, e.g., four, are formed at the distal end of portion 20a which serves as a contact making portion adapted to make electrical contact with a conductive pad of a device to be tested, not shown. outwardly sliding movement of plunger 20 is limited by bearing surface 20b engaging a reduced diameter portion at distal end 18b with distal end 20a extending beyond plunger barrel 18 a selected distance, e.g., 0.020 of an inch when in that position. The opposite end 20d of the plunger is preferably formed with a face surface inclined relative to a plane perpendicular to the longitudinal axis 2 of barrel 18 and plunger 20 at a suitable angle, e.g. 15 degrees, to provide contact pressure for the contact portion of plunger 20 by means of a spring to be discussed below, as well as suitable contact pressure between bearing surface 20b and the inside surface of barrel 18 in a known manner. A biasing ball 22 of electrically conductive material such as gold plated stainless steel is disposed adjacent to end face 20d. A coil spring 24 formed of suitable non-corrosive material such as stainless steel and having a selected spring force extends between biasing ball 22 and a sealing ball 26 formed of suitable non corrosive material such as stainless steel which is disposed adjacent to constriction 18a. This arrangement provides a selected biasing force on plunger 20 urging the plunger in a given direction, i.e., outwardly and at the same time provides a main electrical path from the plunger through the bearing surface to the plunger barrel 18, signal sleeve 16 to signal conductor 1a and an alternative path from plunger 20 through biasing ball 22 to plunger barrel 18 and then through signal sleeve 16 to signal conductor 1a. It should be understood that, if desired, sealing ball 26 can be omitted with spring 24 extending directly to constriction 18a.

Outer ground assembly 14 comprises a cylindrical open ended tubular ground sleeve 28 formed of electrically conductive material, such as gold plated brass, which is received over the outer braid ground conductor 1b and connected thereto as by soldering, crimping or the like for optimum electrical and mechanical interconnection. An outer cylindrical, tubular ground plunger 30 formed of suitable electrically conductive material, such as gold plated, hardened beryllium copper, is received on ground sleeve 28, preferably with a force fit, and is fixedly attached thereto as by the use of retention dimples. Although the particular number of dimples is a matter of choice, two axially spaced apart sets 30a,30b, each having a plurality of dimples, such as four spaced ninety degrees apart, has been found to be suitable. Ground plunger 30 is provided, at its opposite end, with a suitable electrical contact configuration, such as a plurality of projections 30d.

First and second cylindrical annular spacer members 32,34, formed of suitable dielectric material, such as Teflon, are received in ground plunger 30 in spaced apart relation. Spacer member 32 is formed with a stepped inner diameter having a first coaxial, smaller, diameter 32a sized to receive signal sleeve 16 and a second coaxial, larger, diameter 32b sized to receive plunger barrel 18 thereby providing a defined spacing relationship between the inside surface of ground plunger 30 and signal sleeve 16. Spacer member 34 has a coaxial inner diameter 34a sized to receive plunger barrel 18. Spacer members 32,34 serve to maintain the inner contact assembly 12 centered within outer contact assembly 14 and maintain them in a coaxial relationship to optimize the effectiveness of the dielectric spacing between the two assemblies. The spacer members are fixed within the ground plunger 30 by suitable retention means such as a plurality of deformations in a reduced outer diameter section forming dimples 30e,30f respectively, preferably spaced ninety degrees apart at each axial location. An annular flange 30g extends radially outwardly from ground plunger 30 and serves both as a retention projection, to be discussed below, and a biasing surface for a coil spring 36, formed of suitable non-corrosive material, such as stainless steel, received around ground plunger 30. In use, coaxial contact assembly 10 is slidingly received in a mounting bore 4a of an appropriate test head support 4 or the like. It will be understood that support 4 typically would have a selected array of bores 4a for receipt of individual coaxial contact assemblies 10. An annular surface 4b of support 4 serves as a fixed spring seat for one end of spring 36 which urges ground plunger 30, along with cable 1, in the above noted given direction, i.e., toward the right as seen in the drawings. Although shown as part of support 4, surface 4b could be part of a separate sleeve received within the bore formed in support 4, if desired, as will be discussed below in relation to FIG. 6. Outward movement of the ground plunger is limited by retainer plate 6 attached to support 4, having a bore 6a which receives ground plunger 30 with a diameter slightly smaller than the outer diameter of flange 30g. The spring force of spring 36 is chosen to be greater than that of plunger spring 24 to allow separate movement of the contact portion of inner contact assembly 12 until coplanarity is achieved with the contact portion of ground plunger 30 of outer ground assembly 14, to be discussed below. By way of example, plunger spring 24 can be used having approximately half the force potential of spring 36.

As shown in FIG. 3, which is the "at rest" position of the coaxial contact assembly 10, plunger 20 extends in the given direction beyond ground plunger 30 a selected distance, preferably approximately 0.020 of an inch. When a contact pad on a circuit board (not shown) or the like to be tested is brought into engagement with tips 20c, plunger 20 will be depressed against the bias of plunger spring 24 sliding inwardly until coplanarity is achieved with contact points 30d engaging an outer ground contact pad on the circuit board in the position shown in FIG. 4. Further motion will cause the ground plunger to be depressed against the higher force spring 36 carrying the entire coaxial contact assembly 10 for up to another 0.070 to 0.090 of an inch to the position shown in FIG. 5 ensuring that predictable contact force is obtained for both the inner and outer contact portions. By combining the motion of the ground plunger 30 and plunger 20 the overall length of the assembly can be minimized concomitantly minimizing any mismatch in impedance to improve the overall performance of the coaxial contact assembly. With reference to FIG. 6, a modified coaxial contact assembly 10' is shown which incorporates the contact assembly shown in FIGS. 1–5 along with a mounting sleeve 38. Mounting sleeve 38 is fixedly received in a bore of a test head support (not shown) with surface 38b formed in mounting sleeve 38b being comparable to surface 4b of FIGS. 3–5 and deformations 38a serving to limit outward movement of ground plunger 30 being comparable to retainer plate 6 of FIGS. 3–5.

With reference to FIG. 7, an alternative embodiment 10" is shown for use in applications where the provision of a replaceable inner contact assembly is not desired in which inner plunger barrel 18 is attached directly to a tinned signal conductor 1a' to provide a dedicated assembly. Plunger barrel 18 is crimped directly to the signal conductor eliminating sleeve 16 and obviating the interconnection of sleeve 16 as by soldering shown in the FIGS. 3–5 embodiment. This permits a wider choice in dielectric materials used in the coaxial cable. Further, a larger diameter signal conductor can be employed with the same size contact assembly thereby enhancing strength of the assembly. In addition, the sliding contact interface of sleeve 16 and plunger 18 of the FIGS. 3–5 embodiment is eliminated to further enhance signal integrity.

Figure 8:
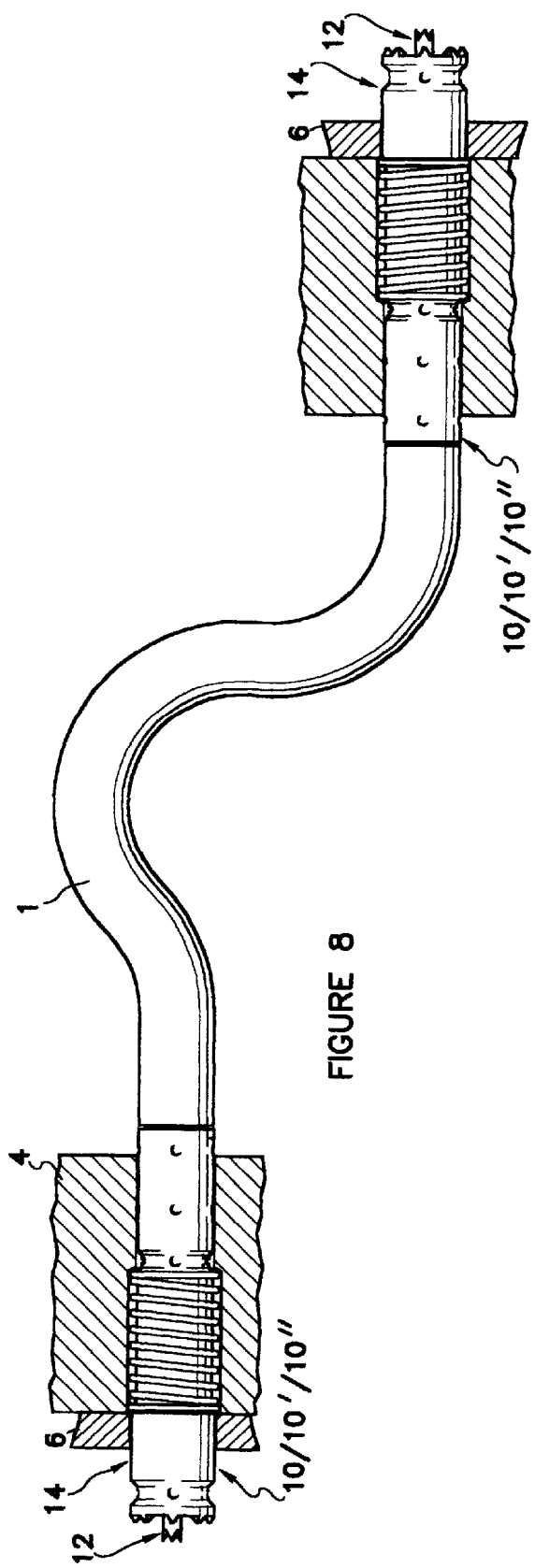
FIG. 8 is a front elevational view showing contact assemblies made in accordance with the invention in a double-ended configuration.

FIG. 8 shows the use of the contact assembly made according with the invention in a flexible, double-ended configuration for mounting in either offset or in-line relationship. As shown in the drawing, a first contact assembly 10/10'/10" is connected to one end of a flexible coaxial cable 1 and mounted in a first test head support 4 and a second contact assembly 10/10'/10" is connected to the opposite end of the cable and mounted in a second test head support 4. The first and second test head supports are shown offset however the placement of the test head supports can be in-line as well if desired to provide more flexibility in circuit board design involving mother and daughter boards.

Figure 5:
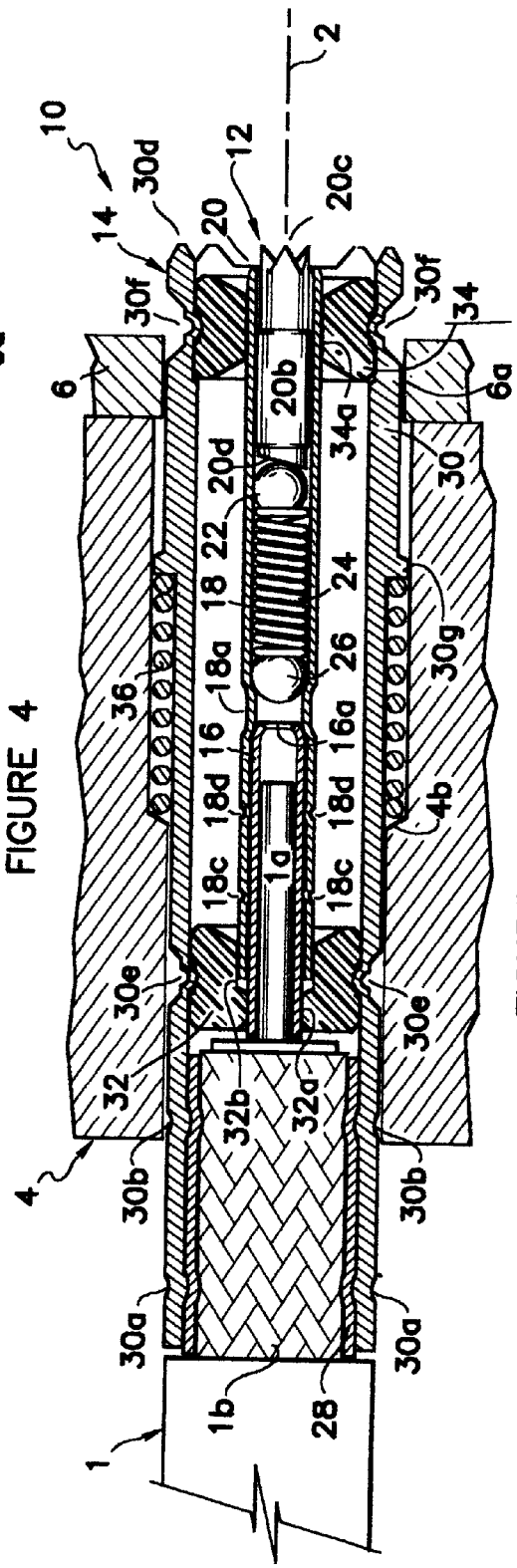
Figure 9:
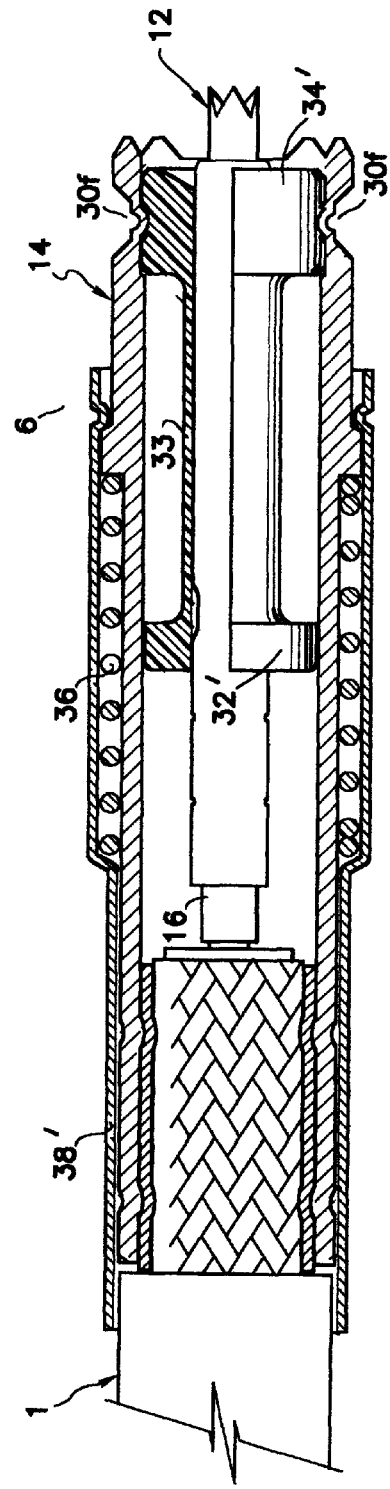
FIG. 9 is a front elevational view, partly in cross section and partly broken away to show a modified coaxial spacing member.

FIG. 9 shows an alternative spacing arrangement for maintaining ground plunger 30 and inner contact plunger barrel 18 in spaced, coaxial relationship by connecting spacer portions 32' and 34' through a reduced diameter intermediate cylindrical web 33 to provide an annular air space having an inner diameter slightly greater than in the FIGS. 3–5 embodiment and a near air effective dielectric between ground plunger 30 and inner plunger barrel 18. The FIG. 9 spacer, formed of suitable dielectric material, such as Teflon, decreases the assembly part count and steps involved in assembling the apparatus. Only one spacer member needs to be handled and only a single set of deformations, e.g., 30f, are required for retention.

It will be understood that the invention includes all modifications and equivalents of the described embodiments falling within the scope of the appended claims.

What is claimed:

1. An electrical coaxial contact assembly for use with a coaxial cable having an inner signal conductor and an outer ground conductor comprising:

an electrically conductive inner contact assembly having a contact portion movable along a longitudinal axis and biased by a first spring in a given direction to a first extremity of the inner contact, the inner contact assembly being electrically connected to the inner signal conductor of the coaxial cable, an electrically conductive, one piece, outer ground plunger having a longitudinally extending bore and having first and second opposite ends, a contact portion formed at the first end of the around plunger and the second end of the around plunger fixedly attached to the outer around conductor of the coaxial cable, the ground plunger movable with the coaxial cable along the longitudinal axis and biased by a second spring in the given direction to a first extremity of the outer ground plunger, the inner contact assembly being disposed within the bore of the ground plunger and means to electrically separate the inner contact assembly and the ground plunger and to maintain them in coaxial relation to one another.

2. An electrical coaxial contact assembly for use with a coaxial cable having an inner signal conductor and an outer ground conductor comprising:

an electrically conductive inner contact assembly having a contact portion movable along a longitudinal axis and biased by a first spring in a given direction to a first extremity of the inner contact, the inner contact assembly being electrically connected to the inner signal conductor of the coaxial cable, an electrically conductive outer ground plunger having a contact portion and having a longitudinally extending bore, the ground plunger movable alone the longitudinal axis and biased by a second spring in the given direction to a first extremity of the outer ground plunger, the inner contact assembly being disposed within the bore of the ground plunger and means to electrically separate the inner contact assembly and the ground plunger and to maintain them in coaxial relation to one another, the ground plunger being fixedly attached to the outer ground conductor of the coaxial cable, and a mounting sleeve having a bore in which the ground plunger is received, a spring seat formed in the mounting sleeve with one end of the second spring seated in the spring seat.

3. An electrical coaxial contact assembly according to claim 1 in which the second spring has a spring force greater than the first spring.

4. An electrical coaxial contact assembly according to claim 1 further comprising a ground sleeve of electrically conductive material disposed intermediate the outer ground conductor and the ground plunger, the ground sleeve fixedly secured to the outer ground conductor of the coaxial cable with the ground plunger fixedly attached to the ground sleeve.

5. An electrical coaxial contact assembly according to claim 1 in which the electrical coaxial contact assembly is connected to one end of a flexible coaxial cable having first and second ends and a second electrical coaxial contact assembly according to claim 1 is connected to the other end of the flexible coaxial cable to provide a double-ended contact assembly in either one of an in-line and offset mounting of the contact assemblies.

6. An electrical coaxial contact assembly according to claim 1 in which the outer ground plunger is a generally cylindrical tube and in which the means to electrically separate the inner contact and the ground plunger and to maintain them in coaxial, spaced apart relation to one another comprises spaced apart annular cylindrical spacer portions formed of dielectric material having a centrally disposed bore, the inner contact assembly received in the centrally disposed bore and the spacer portions received in the generally cylindrical tube.

7. An electrical coaxial contact assembly for use with a coaxial cable having an inner signal conductor and an outer ground conductor comprising:

an electrically conductive inner contact assembly having a contact portion movable along a longitudinal axis and biased by a first spring in a given direction to a first extremity of the inner contact, the inner contact assembly being electrically connected to the inner signal conductor of the coaxial cable, an electrically conductive outer ground plunger having a contact portion and having a longitudinally extending bore, the ground plunger movable along the longitudinal axis and biased by a second spring in the given direction to a first extremity of the outer ground plunger, the inner contact assembly being disposed within the bore of the ground plunger and means to electrically separate the inner contact assembly and the ground plunger and to maintain them in coaxial relation to one another comprising spaced apart annular cylindrical spacer portions formed of dielectric material having a centrally disposed bore, the inner contact assembly received in the centrally disposed bore and the spacer portions received in the generally cylindrical tube, the spaced apart spacer portions being integrally formed and joined together by a reduced diameter web to provide an annular air space between the inner contact assembly and the outer ground plunger, and the ground plunger being fixedly attached to the outer ground conductor of the coaxial cable.

8. An electrical coaxial contact assembly according to claim 6 in which the spacer portions are formed by individual first and second, spaced apart, members.

9. An electrical coaxial contact assembly according to claim 1 in which the contact portion of the inner contact assembly projects in the given direction beyond the ground plunger a selected distance, when in the at rest position.

10. An electrical coaxial contact assembly according to claim 9 in which the selected distance is approximately 0.020 of an inch.

11. An electrical coaxial contact assembly for use with a coaxial cable having an inner signal conductor and an outer ground conductor comprising:

an inner contact assembly having an electrically conductive, open ended plunger barrel having a selected length and a bore, the barrel received on the inner signal conductor, a plunger received in the bore, the plunger having an inner contact portion projecting out of the barrel and biasing means biasing the plunger in a given direction out of the barrel, an electrically conductive, cylindrical, tubular ground plunger having a bore and having an end fixedly attached to the outer ground conductor of the coaxial cable, the ground plunger having an outer contact portion, dielectric annular spacer portions disposed within the bore of the ground plunger at spaced apart locations, the spacer portions having a bore in which the inner contact assembly is received and maintained in a coaxial spaced apart relationship with the ground plunger, a ground plunger spring received about the ground plunger for biasing the ground plunger and coaxial cable in the given direction, the inner contact portion of the inner contact assembly extending beyond the outer contact portion of the ground plunger in the given direction a selected amount when in the at rest position, the spring force of the ground plunger spring being less than the spring force of the biasing means of the inner contact assembly, and a signal sleeve having a distal end received on an exposed portion of the signal conductor of the coaxial cable, the open ended plunger barrel formed with a constriction in the bore of the barrel, the plunger barrel received on the signal sleeve with the distal end engaging the constriction to form a reference location for the contact assembly.

* * * * *